United States Patent [19]

Olsson

[11] 4,169,641

[45] Oct. 2, 1979

[54] CONNECTOR CLIP FOR FLAT CABLE

[75] Inventor: Billy E. Olsson, Cumberland County, Pa.

[73] Assignee: AMP Incorporated, Harrisburg, Pa.

[21] Appl. No.: 918,138

[22] Filed: Jun. 22, 1978

[51] Int. Cl.[2] .......... H05K 1/12

[52] U.S. Cl. .......... 339/17 F; 339/176 MF

[58] Field of Search .......... 339/17 CF, 17 F, 176 MF

[56] References Cited

U.S. PATENT DOCUMENTS

| | | | |
|---|---|---|---|
| 3,335,327 | 8/1967 | Damon et al. | 339/17 CF X |
| 3,629,787 | 12/1971 | Wilson | 339/176 MF X |

FOREIGN PATENT DOCUMENTS

| | | | |
|---|---|---|---|
| 2241888 | 3/1975 | France | 339/176 MF |
| 1194539 | 6/1970 | United Kingdom | 339/176 MF |

*Primary Examiner*—E. F. Desmond

*Attorney, Agent, or Firm*—F. W. Raring

[57] ABSTRACT

A one piece stamped and formed connector clip for connecting cable conductors to conductors on a circuit board comprises parallel spaced-apart co-planar support strips and a clip bar which extends between the support strips in a plane offset from the plane of the support strips. A plurality of cantilever springs extend from the clip bar obliquely towards and past the plane of the support strips. When the connector clip is mounted on a circuit board in straddling relationship to the circuit board conductors, and with the support strips against the circuit board, the springs will be preloaded against the circuit board conductors. The end of the cable is passed beneath the clip bar and pushed under the spring fingers so that the spring fingers urge the conductors of the cable against the circuit board conductors.

2 Claims, 7 Drawing Figures

Fig. 1
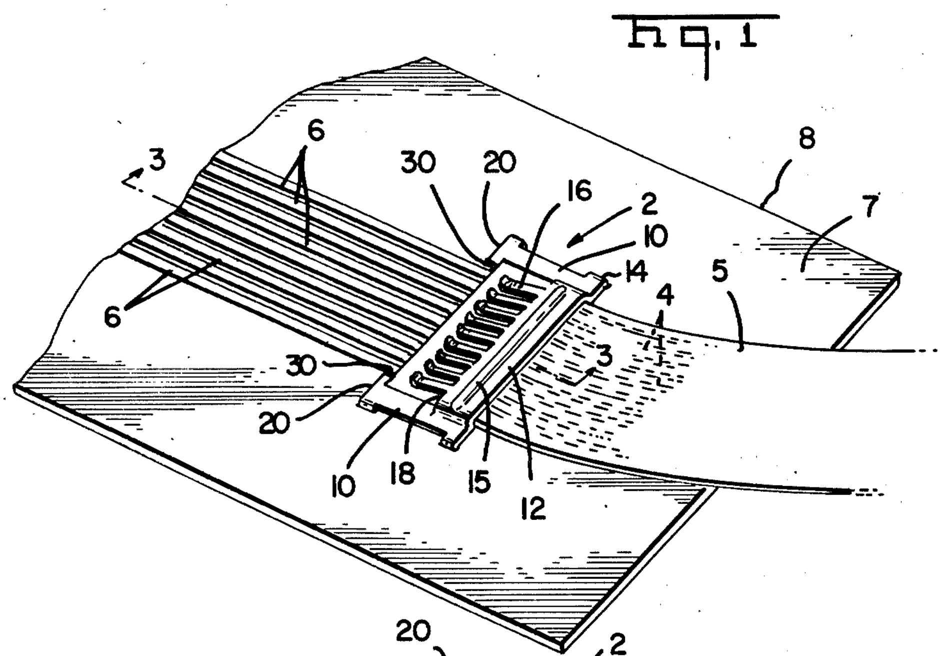
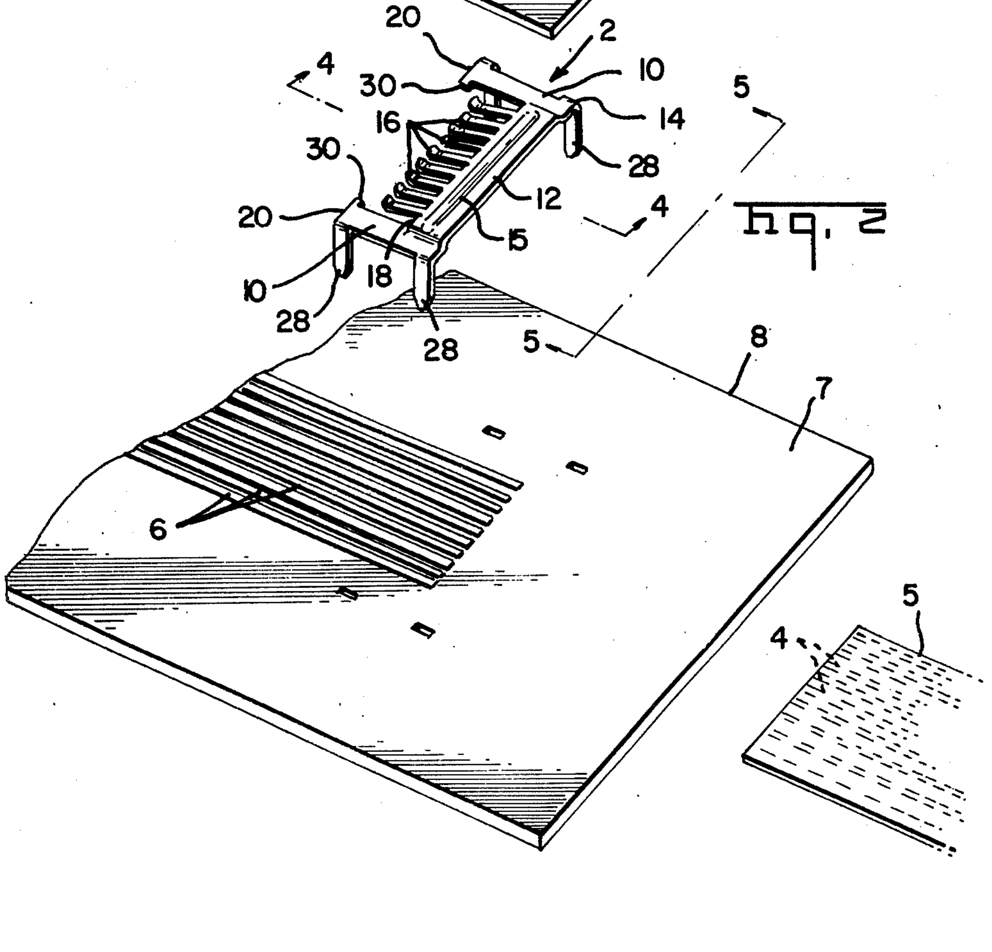
Fig. 2

CONNECTOR CLIP FOR FLAT CABLE

DESCRIPTION

BACKGROUND OF THE INVENTION

When the conductors in a flat conductor cable must be disengageably connected to conductors on a circuit board, it is common practice to use electrical connectors of a type comprising an insulating housing having contact terminals therein which are soldered to the conductors on the circuit board. The housing and the contact terminals are arranged such that the end of the flat conductor cable can be inserted into the housing and upon insertion, the conductors of the cable will be electrically contacted by the contact terminals. Other types of connectors for connecting flat conductor cable conductors to conductors on a circuit board are also known and most of them consist of an insulating housing containing contact terminals which conduct current from the cable conductors to the circuit board conductors.

The present invention is directed to the achievement of an improved and simplified connector for connecting the conductors of a flat conductor cable to conductors on a circuit board and which comprises a single one-piece stamped and formed device which holds the cable conductors directly against the circuit board conductors. A connector in accordance with the invention comprises a flat clip member having parallel spaced-apart coplanar support strips and a clip bar which extends between the support strips in a plane which is offset from the plane of the support strips. A plurality of cantilever springs extend from the clip bar obliquely towards and past the plane of the support strips.

These cantilever springs are located between the support strips, the spacing between the springs being the same as the spacing between the cable conductors and the circuit board conductors. The connector clip is mounted on the circuit board in straddling relationship to the circuit board conductors with the cantilever springs in alignment with the circuit board conductors. The end of the flat conductor cable is inserted beneath the clip bar and pushed parallel to the springs and the support strips until the cable is beneath the free ends of the springs and the cable conductors are against the circuit board conductors. The springs bear against the insulated top surface of the cable so that the circuit board conductors and the cable conductors are pressed against each other to establish electrical contact.

The accompanying drawing shows a preferred embodiment of the invention and the drawing figures are described as follows:

FIG. 1 is a perspective view of a portion of a circuit board having conductors thereon, a connector clip mounted thereon and a cable inserted into the connector clip.

FIG. 2 is a view similar to FIG. 1 but showing the connector clip and the cable exploded from the circuit board.

Figure 3:
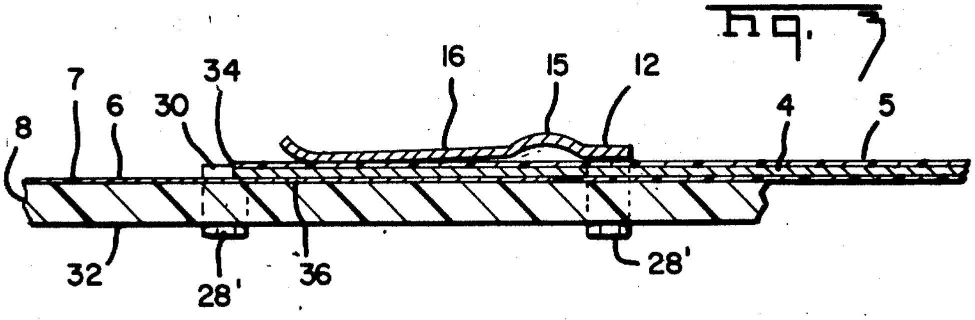
FIG. 3 is a cross-sectional view taken along the lines 3—3 of FIG. 1.

A connector clip 2 in accordance with the invention serve to connect the cable conductors 4 of a flat conductor cable 5 to panel conductors 6 on the upper surface 7 of a panel-like member 8. The cable 5 contains a plurality of flat conductors 4 which are within a film of insulating material such as a polyester film. The panel conductors 6 are adhered to the surface 7 and it will be understood that the member 8 may be a portion of a circuit board or may simply be a support for connecting cables to each other.

The connector clip 2 is a stamped and formed device of a suitable material having good spring characteristics and has spaced-apart parallel support strips 10 which are connected to each other by a transversely extending clip bar 12 which extends between corresponding ends 14 of the support strips. The clip bar may be embossed as shown at 15 for stiffening purposes.

Figure 4:
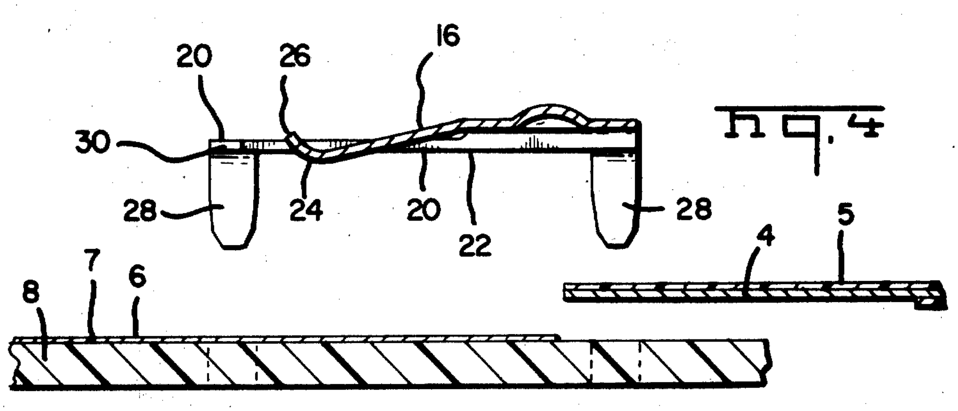
FIG. 4 is a cross-sectional view of a connector clip taken along the lines 4—4 of FIG. 2.
Figure 5:
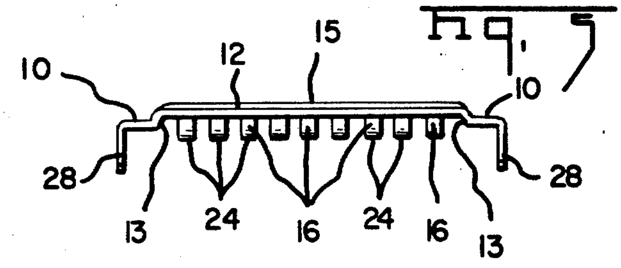
FIG. 5 is an end view of the connector clip looking in the direction of the arrows 5—5 of FIG. 2.

A plurality of cantilever spring fingers 16 extend from the edge 18 of the clip bar and parallel to the support strips 10. The clip bar is upwardly displaced from the plane of the support strips (see FIG. 5) and the fingers and springs 16 extend obliquely downwardly as viewed in FIG. 4 and past the downwardly facing surfaces 22 of the support strips. Each spring is reversely formed as shown at 24 so that the end portion 26 curves upwardly from the portion 24.

Integral locking ears 28 extend downwardly from the outside edges of the support strips 10 at the ends 14, 20, these locking ears being intended for insertion through holes in the panel member 8 so that they can be bent against the underside 32 of the panel member as shown in FIG. 3. Cable stop ears 30 extend inwardly from the inner edges of the support strips 10 at the ends 20. These ears engage the leading edge of the cable upon insertion as will be explained below.

The dimensions of the clip should be related to the dimensions of the cable 5; thus the distance between the opposed shoulders 13 at the ends of the clip bar should be slightly greater than the width of the cable and the downwardly facing surface or underside of the clip bar should be spaced from the downwardly facing surfaces 22 of the support strips by a distance which is slightly greater than the thickness of the cable.

In use, the connector clip 2 is assembled to the panel member by inserting the ears 28 through openings in the panel member 8 and staking these ears or bending them against the panel member while the downwardly facing surfaces of the support strips 10 are held against the surface 7 of the panel. If desired, metallized surfaces can be provided in the vicinity of the holes in the panel and the bent over ears can be soldered to these surfaces.

When the connector clip is assembled to the panel the individual cantilever springs 16 will be flexed upwardly by virtue of the fact that they normally extend downwardly beyond the undersides 22 of the support strips. The fingers or springs will therefore be pre-loaded against the conductors 6 on the panel.

The cable 5 is prepared by removing a portion of the insulation from the underside thereof at 36 adjacent to the leading end 34. This step can be carried out by a stripping machine of the type having rotating abrasive wheels. The conductors in the cable can be connected to the conductors 6 by merely inserting the end 34 of the cable through the opening between the clip bar 12 and the surface 7. The side edges of the cable will be guided by the shoulders 13 and by the inner side edges of the support strips. When the cable is fully inserted, its end 34 will be against the stop ears 30 and the conductors 4 in the cable will be against the conductors 6. The spring fingers impose a relatively high unit pressure on the conductors 4 which is transmitted through the insulating film of the cable. This high unit force results in an extremely stable electrical connection between the conductors 4 and the conductors 6.

Figure 7:
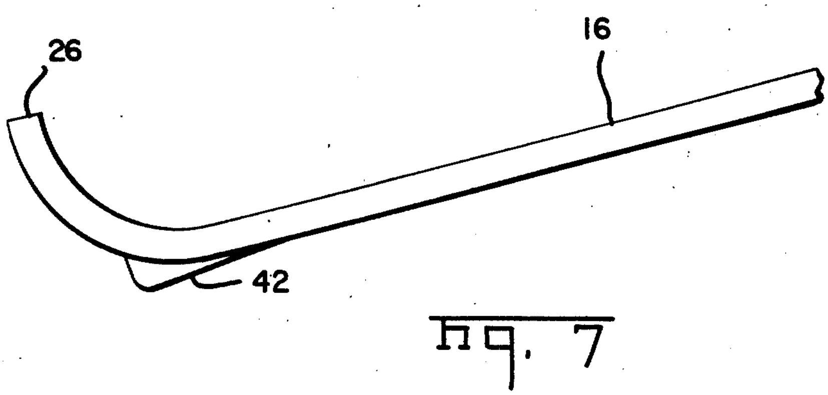
FIG. 7 is a fragmentary view of the end portion of one of the cantilever springs of the clip showing a modified construction.

If desired, the ends of the cantilever springs can be formed with a downwardly projecting boss 42, FIG. 7, having a shoulder which faces forwardly of the springs, that is towards the clip bar 12. The provision of such bosses on the ends of the springs will not interfere with insertion of the cable but will increase the force required to remove the cable from beneath the clip and thereby provide a strain relief for the cable.

The individual clips may be coated with insulating material if desired, for example, a thin varnish type film of the type used on coil wires and consisting of a resin, such as polyvinyl formal resin. It is not, however, essential that the clip be insulated under all circumstances since it does not contact the conductors when in use; only the insulated upper surface of the cable 5 is engaged by the springs.

Figure 6:
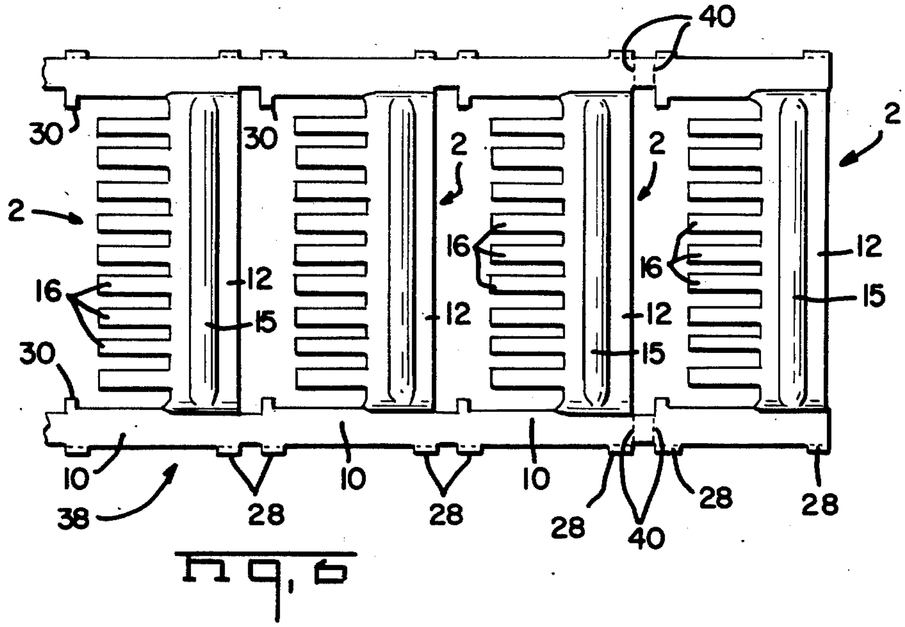
FIG. 6 is a plan view of a short section of continuous strip of connector clips in accordance with the invention.

Connector clips in accordance with the invention may be produced as a continuous strip as shown in FIG. 6 with the support strips serving as carrier strips and with the clip bars extending between the carrier strips. The individual clips can be assembled to the circuit board with the aid of a suitable insertion apparatus which shears the leading clip from the strip along the shear lines 40 and move the severed clip member to the board.

Connector clips in accordance with the invention can be manufactured from any suitable spring material such as a spring steel. Connector clips in accordance with the invention can be produced at extremely low cost since the material is itself low in cost and the strip in FIG. 6 is produced in a relatively simple stamping operation.

As shown in FIG. 1, connector clips in accordance with the invention require very little space on the circuit board in that the clip 2 is only slightly wider than the cable 4 and the band of conductors 6 on the circuit board, as is apparent from FIG. 3, a connector clip mounted on a circuit board has an extremely low profile and very little space and the vertical direction is therefore required.

I claim:

1. A one-piece stamped and formed connector clip which is mounted on a panel-like member for connecting the side-by-side parallel cable conductors of a flat cable to side-by-side parallel panel conductors on said panel-like member, said connector clip comprising:

a pair of parallel spaced-apart support strips and a clip bar integral with, and extending between, said support strips, said support strips being disposed in a plane which is offset from the plane of said clip bar, said support strips being against said panel-like member and in straddling relationship to said panel conductors with said clip bar spaced from, and extending transversely of, said panel conductors, mechanical fastening means on said support strips and said panel-like member serving to secure said support strips to said panel-like member rigidly and permanently, said clip bar having one side edge which extends between said support strips, a plurality of spaced-apart cantilever springs extending from said one side edge of said clip bar obliquely towards said panel-like member, each of said springs being in alignment with, and resiliently preloaded against, one of said panel conductors, and cantilever springs being between said support strips, and a cable stop ear on each of said support strips, said cable stop ears extending inwardly of said clip and being located beyond the free ends of said cantilever springs whereby, upon inserting said cable beneath said clip bar and moving said cable towards and past the free ends of said cantilever springs until the end of said cable is against said stop ears, said cable conductors will be held against said panel conductors by said cantilever springs.

2. A one-piece connector clip mounted on a panel-like member as set forth in claim 1, said mechancal fastening means comprising locking ears extending from said support strips and through openings in said panel-like member, said locking ears being bent laterally against the underside of said panel-like member.

* * * * *